(12) United States Patent
Lin

(10) Patent No.: US 11,978,638 B2
(45) Date of Patent: May 7, 2024

(54) SEMICONDUCTOR STRUCTURE AND METHOD FOR FORMING THE SAME

(71) Applicant: Winbond Electronics Corp., Taichung (TW)

(72) Inventor: Chang-Hung Lin, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 161 days.

(21) Appl. No.: 17/576,606

(22) Filed: Jan. 14, 2022

(65) Prior Publication Data

US 2023/0230841 A1 Jul. 20, 2023

(51) Int. Cl.
*H01L 21/308* (2006.01)
*H01L 21/762* (2006.01)
*H01L 27/108* (2006.01)
*H10B 12/00* (2023.01)

(52) U.S. Cl.
CPC .... *H01L 21/3086* (2013.01); *H01L 21/76224* (2013.01); *H10B 12/09* (2023.02); *H10B 12/50* (2023.02)

(58) Field of Classification Search
CPC ............................... H10B 12/09; H10B 12/50
See application file for complete search history.

(56) References Cited

U.S. PATENT DOCUMENTS

| 8,809,162 | B2 | 8/2014 | Lee et al. |
| 9,583,594 | B2 | 2/2017 | Liao et al. |
| 10,840,249 | B2 | 11/2020 | Iwaki |
| 2007/0196986 | A1 | 8/2007 | Ichige et al. |
| 2011/0260286 | A1* | 10/2011 | Lee ........................ H01L 27/105 438/430 |
| 2013/0009273 | A1* | 1/2013 | Kim ........................ H10B 12/09 257/496 |
| 2015/0279879 | A1* | 10/2015 | Chou ................ H01L 21/76229 257/446 |

FOREIGN PATENT DOCUMENTS

CN 102420216 A 4/2012

* cited by examiner

*Primary Examiner* — Walter H Swanson
(74) *Attorney, Agent, or Firm* — MUNCY, GEISSLER, OLDS & LOWE, PC

(57) ABSTRACT

A method for forming a semiconductor structure forming a blocking structure in the periphery region over the bottom layer. The method includes covering the middle layer over the bottom layer and the blocking structure. The method includes forming a patterned photoresist layer over the middle layer. The patterned photoresist layer is in the array region and directly over the blocking structure in the periphery region. The method includes transferring the pattern of the patterned photoresist layer to the bottom layer. The pattern of the patterned photoresist layer directly over the blocking structure is not formed in the bottom layer. The first portion of the substrate is in the array region and is an active area array. The second portion of the substrate is in the periphery region and is a guard ring. The third portion of the substrate is in the periphery region and is a periphery structure.

20 Claims, 5 Drawing Sheets

SEMICONDUCTOR STRUCTURE AND METHOD FOR FORMING THE SAME

BACKGROUND

Technical Field

The disclosure relates to a semiconductor structure and more particularly to a method of forming an active area array.

Description of the Related Art

As the size of integrated circuits shrunk, the density of Dynamic Random Access Memory (DRAM) has increased. The iso dense effect occurs at the edge of active area array regions, resulting in the active area array having different sizes and spacings at the edge of the array region and at the center of the array region. Optical proximity correction (OPC) is needed to solve the iso dense effect problem, which costs more in money and time.

BRIEF SUMMARY

A method for forming a semiconductor structure includes forming a substrate including an array region and a periphery region. The method also includes forming a bottom layer over the substrate. The method also includes forming a blocking structure over the bottom layer. The blocking structure is in the periphery region. The method also includes covering the middle layer over the bottom layer and the blocking structure. The method also includes forming a patterned photoresist layer over the middle layer, a first portion of the patterned photoresist layer is disposed in the array region and directly over the blocking structure in the periphery region. The method also includes transferring the pattern of the patterned photoresist layer to the bottom layer in sequence. The pattern of the patterned photoresist layer directly over the blocking structure is not formed in the bottom layer. The method also includes removing the blocking structure. The method also includes patterning the substrate. The substrate comprises a first portion, a second portion, and a third portion, the first portion of the substrate is in the array region and is an active area array, the second portion of the substrate is in the periphery region and is a guard ring, the third portion of the substrate is in the periphery region and is a periphery structure.

A semiconductor structure includes a substrate comprising an array region and a periphery region. The structure also includes a guard ring disposed in the periphery region abutting and surrounding the array region. The structure also includes an active area array comprising a plurality of active areas disposed in the array region. The structure also includes a periphery structure disposed in the periphery region. The guard ring and the periphery structure are spaced apart with each other.

A detailed description is given in the following embodiments with reference to the accompanying drawings.

DETAILED DESCRIPTION

The embodiments of the present disclosure provide semiconductor a method of forming the same. By forming a blocking structure in the periphery region abutting the array region, and forming an active area array pattern extending in the patterned photoresist layer above the blocking structure, since the iso dense effect occurs at the patterned photoresist layer above the blocking structure, disposing the blocking structure may eliminate the iso dense effect at the edge of active area array pattern and form a guard ring around the array region at the same time.

Figure 1:
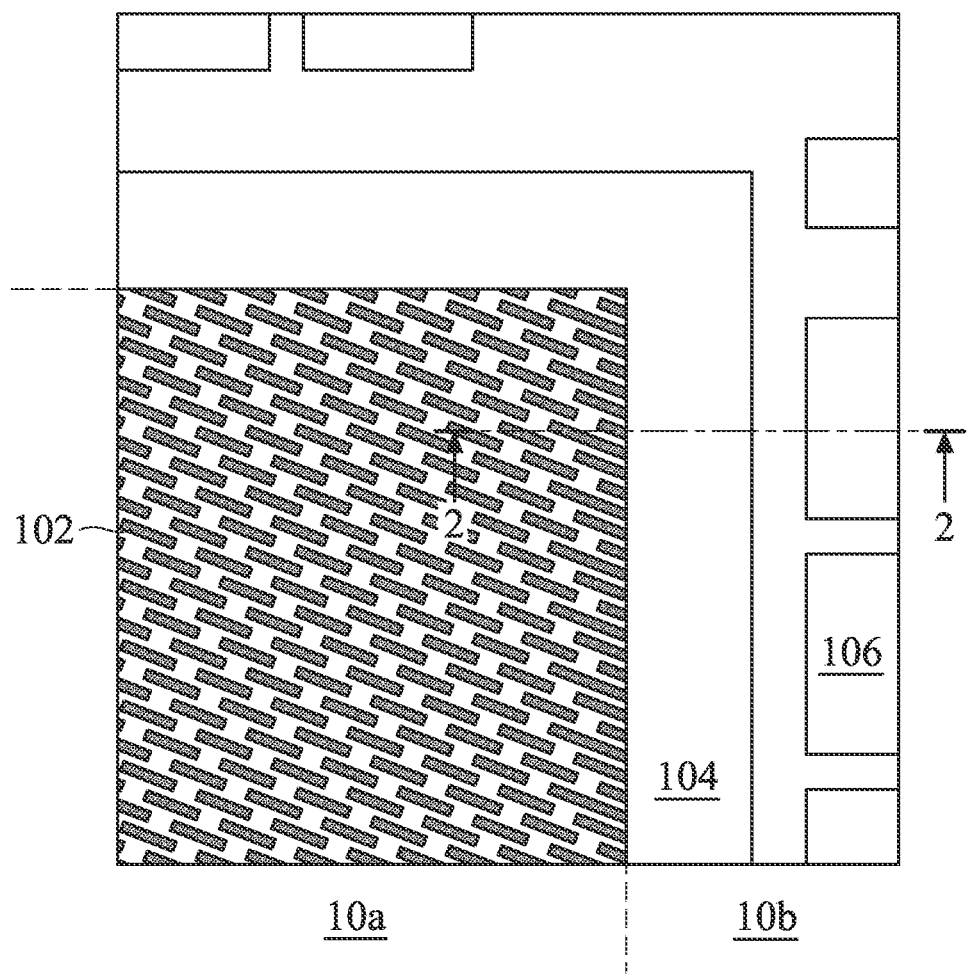
FIG. 1 is a top view of a semiconductor structure in accordance with some embodiments.

FIG. 1 is a top view of a semiconductor structure 100 in accordance with some embodiments. FIGS. 2A-2H are cross-sectional representations of various stages of forming a semiconductor memory structure 100 in accordance with some embodiments. FIGS. 2A-2H show cross-sectional representations of semiconductor memory structure 100 taken along line 2-2 in FIG. 1.

As shown in FIG. 1, the semiconductor structure 100 includes an array region 10a and a periphery region 10b. The array region 10a includes an active area array 102. The periphery region 10b includes a guard ring 104 and a periphery structure 106. The guard ring 104 and the periphery structure 106 are spaced apart with each other. In some embodiments, the guard ring 104 surrounds the array region 10a and abuts the array region 10a.

Figure 2A:
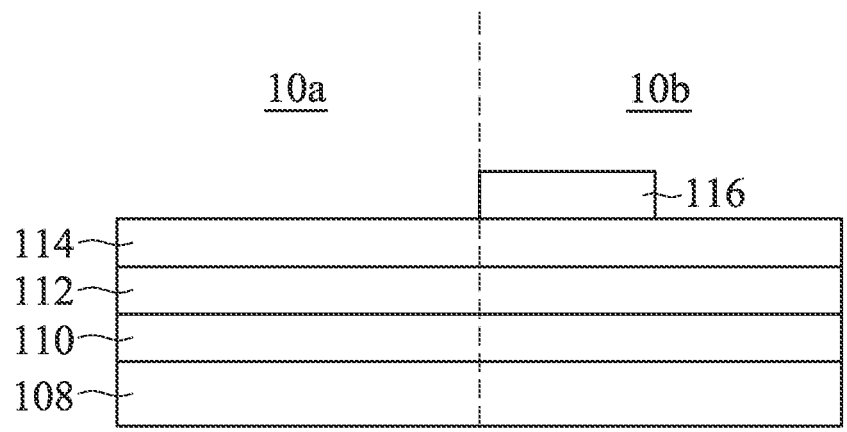
FIGS. 2A-2H are cross-sectional representations of various stages of forming a semiconductor structure in accordance with some embodiments.

As shown in FIG. 2A, the semiconductor structure 100 includes a substrate 108, including the array region 10a and the periphery region 10b. The substrate 108 may be a semiconductor substrate, which may include elementary semiconductor such as Si and Ge; compound semiconductor such GaN, SiC, GaAs, GaF, InP, InAs, InSb, etc.; alloy semiconductor such as SiGe, GaAsP, AlInAs, AlGaAs, GaInAs, GaInAsP, or a combination thereof. In addition, the substrate 108 may also be semiconductor on insulator (SOI). The substrate 108 may have an N-type or a P-type conductivity type. The N-type dopant may include P. As, N, Sb ions, or a combination thereof. The P-type dopant may include. B, Ga, Al, In, $BF_3^+$ ions, or a combination thereof.

Next, an oxide layer 110 is blanketly formed over the substrate 108. In some embodiments, the oxide layer 110 includes oxides such as silicon oxide. The oxide layer 110 may be formed by a deposition process such as a chemical vapor deposition process, a spin-on coating process, a sputtering process, a thermal oxidation process, or a combination thereof.

Next, a bottom layer 112 is blanketly formed over the oxide layer 110. The bottom layer 112 may be an etch stop layer for subsequently etching process. The bottom layer 112 and the oxide layer 110 may be made of different materials with etch selectivity. In some embodiments, the bottom layer 112 includes polysilicon. The bottom layer 112 may be formed by a deposition process such as a chemical vapor deposition process, a spin-on coating process, a sputtering process, or a combination thereof.

Afterwards, a blocking layer 114 is blanketly formed over the bottom layer 112. The blocking layer 114 and the bottom layer 112 may be made of different materials and with etch selectivity. In some embodiments, the blocking layer 114 is in direct contact with the bottom layer 112. In some embodiments, the blocking layer 114 includes nitride such as silicon nitride. The blocking layer 114 may be formed by a deposition process such as a chemical vapor deposition process, a spin-on coating process, a sputtering process, or a combination thereof.

Next, a photoresist layer 116 is formed over the blocking layer 114, and the pattern of the photoresist layer 116 is formed by a photolithography process. In some embodiments, the pattern of the photoresist layer 116 surrounds the array region 10a, and exposes the blocking layer 114 in the array region 10a and the outer of the periphery region 10b. The patterning process may include photoresist coating (such as spin-on coating), soft baking, mask alignment, pattern exposure, post-exposure baking, photoresist development, rinsing and drying (such as hard baking), other applicable techniques, or a combination thereof.

Figure 2B:
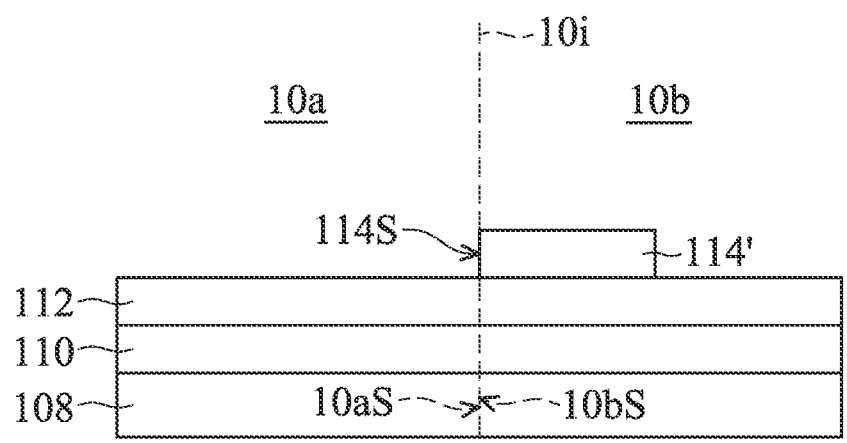

Next, as shown in FIG. 2B, the blocking layer 114 is patterned by the photoresist layer 116 as a mask to form a blocking structure 114'. In some embodiments, the blocking structure 114' is in the periphery region 10b. In some embodiments, the sidewall 114S of the blocking structure 114' is aligned with the interface 10i of the array region 10a and the periphery region 10b. In some embodiments, the sidewall 114S of the blocking structure 114' is vertically aligned with the sidewall 10bS of the periphery region 10b and the sidewall 10aS of the array region 10a.

Figure 2C:
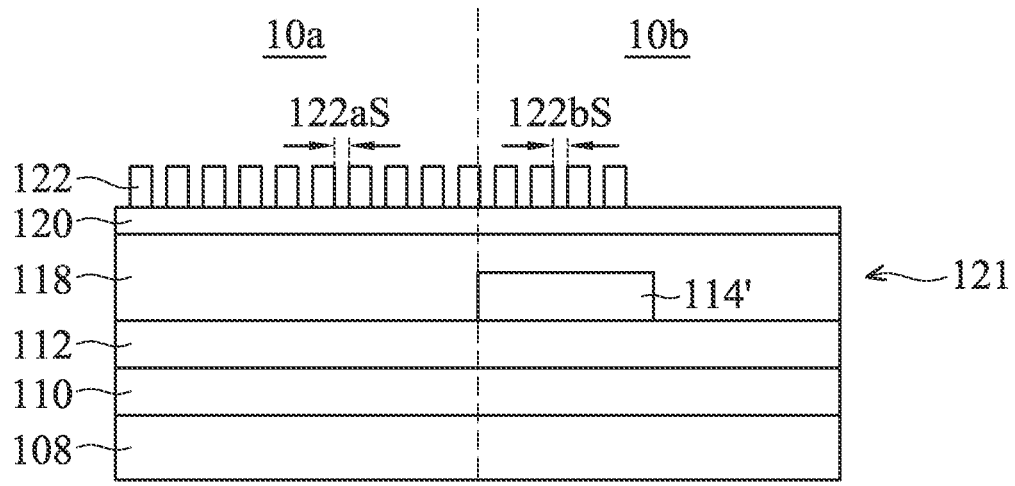

Next, as shown in FIG. 2C, a middle layer 118 is formed covering the bottom layer 112 and the blocking structure 114'. In some embodiments, the top surface of the middle layer 118 is higher than the top surface of the blocking structure 114'. In some embodiments, the middle layer 118 is made of different materials and has etch selectivity with the blocking structure 114' and the bottom layer 112. In some embodiments, the middle layer 118 includes carbon such as spin-on carbon (SOC). The middle layer 118 may be formed by a spin-on coating process, a deposition process, a sputtering process, or a combination thereof.

Afterwards, a top layer 120 is blanketly formed over the middle layer 118. The top layer 120 may be an etch stop layer for subsequently etching process. The top layer 120 and the bottom layer 112 may be made of the same material. In some embodiments, the top layer 120 includes polysilicon. The top layer 120 may be formed by a deposition process such as a chemical vapor deposition process, a spin-on coating process, a sputtering process, or a combination thereof.

A tri-layer mask structure 121 is formed aver the oxide layer 110. The tri-layer mask structure 121 may include the bottom layer 112, the middle layer 118, and the top layer 120. In some embodiments, the blocking structure 114' is formed in the middle layer 118, and the middle layer 118 covers the blocking structure 114'.

Next, a patterned mask layer 122 is formed over the top layer 120 of the tri-layer mask structure 121. The patterned mask layer 122 may define the location of the active area array 120 in the array region 10a, such as the location of the line forming the active area 102. In some embodiments, the patterned mask layer 122 includes oxide such as silicon oxide. In some embodiments, the pattern of the patterned mask layer 122 is in the array region 10a, and extends directly over the blocking structure 114' in the periphery region 10b. In some embodiments, the pattern of the patterned mask layer 122 vertically overlaps the blocking structure 114'. The pattern of the patterned mask layer 122 in the array region 10a has a spacing 122aS, and the pattern of the patterned mask layer 122 in the periphery region 10b has a spacing 122bS. In some embodiments, the spacing 122aS and the spacing 122bS are substantially the same.

Figure 2D:
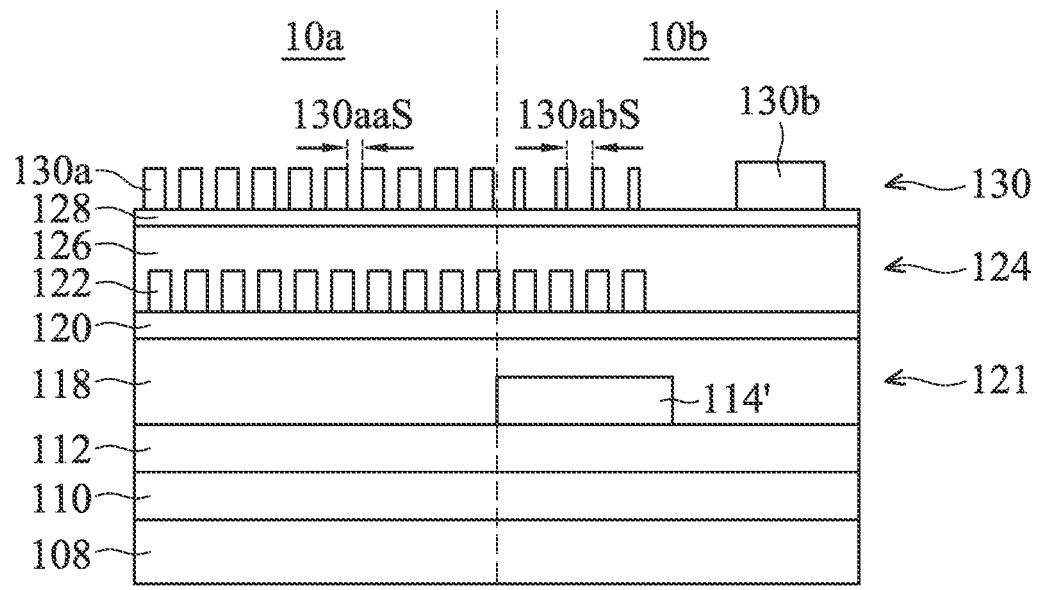

Next, as shown in FIG. 2D, forming a tri-layer photoresist structure 124 over the patterned mask layer 122. The tri-layer photoresist structure 124 may include a bottom layer 126, a middle layer 128, and a top layer 130. The bottom layer 126 may include carbon such as spin-on carbon. The middle layer 128 may include SOSA. The top layer 130 may include photoresist. The top layer 130 may also referred to as the patterned photoresist layer 130. The bottom layer 126 may be formed over the top layer 120 of the tri-layer mask structure 121 and the patterned mask layer 122 by a spin-on coating process, a deposition process, a sputtering process, or a combination thereof. The bottom layer 126 may cover the sidewalls and the top surface of the patterned mask layer 122. The middle layer 128 may be blanketly formed over the bottom layer 126 by a deposition process or a spin-on coating process. The top layer 130 may be formed over the middle layer 128 by a spray coating process, a spin-on coating process, or a deposition process, and the top layer 130 is patterned.

The patterned photoresist layer 130 includes a first portion 130a and a second portion 130b. The first portion 130a may define the location of the active area array 102, such as the line cutting off the active area 102. Therefore, the first portion 130a of the patterned photoresist layer 130 is different from the pattern of the mask layer 122, and is partially overlapped with the pattern of the mask layer 122 to form the active area array 102. The second portion 130b of the patterned photoresist layer 130 may define a pattern in the periphery region 10b to form the periphery structure 106 in the FIG. 1. In some embodiments, the active area array 102 and the periphery structure 106 are defined and formed by the same patterned photoresist layer 130.

The first portion 130a of the patterned photoresist layer 130 is in the array region 10a and directly above the blocking structure 114' in the periphery region 10b. The first portion 130a of the patterned photoresist layer 130 in the array region 10a has a spacing 130aaS, and first portion 130a of the patterned photoresist layer 130 in the periphery region 10b has a spacing 130abS. In some embodiments, since the iso dense effect occurs at the array edge, the spacing 130abS is not equal to the spacing 130aaS, and the spacing 130abS is greater than the spacing 130aaS.

Figure 2E:
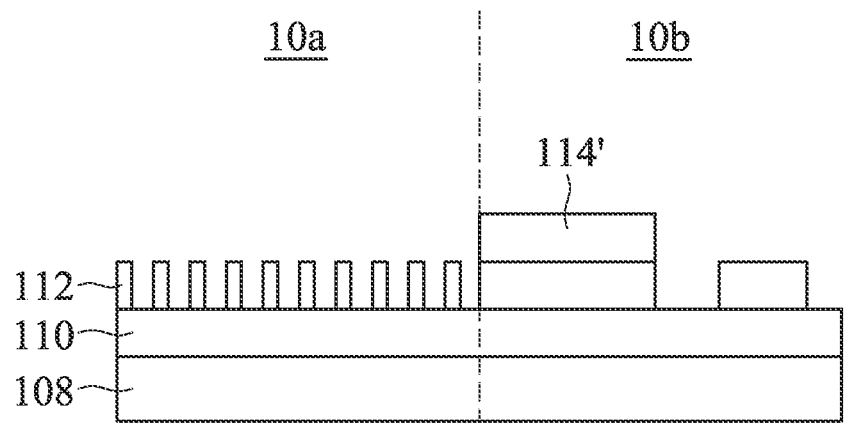

Next, as shown in FIG. 2E, the bottom layer 112 is patterned by using the patterned photoresist layer 130 and the patterned mask layer 122 as mask. By the photolithography process and etching process, the patterns of the patterned photoresist layer 130 and the patterned mask layer 122 may be transferred to the bottom layer 112. For example, by using the patterned photoresist layer 130 as an etching mask, the middle layer 128 may be patterned to transfer the pattern of the patterned photoresist layer 130 to the middle layer 128, and the patterned photoresist layer 130 is removed when patterning the middle layer 128. Next, by using the middle layer 128 as an etching mask, the bottom layer 126 and the patterned mask layer 122 may be patterned and etched to transfer the pattern of the patterned photoresist layer 130 to the bottom layer 126 and the patterned mask layer 122. At this time, the pattern of the active area array 102 is formed in the patterned mask layer 122, and the pattern of the periphery structure 106 is formed in the bottom layer 126.

Next, by using the patterned mask layer 122 as an etching mask, the top layer 120 is patterned and etched, and the patterned mask layer 122 is removed when patterning the top layer 120. Next, by using the top layer 120 as an etching mask, the middle layer 118 is patterned and etched, and the top layer 120 is removed when patterning the middle layer 118. Since the blocking layer 114 and the middle layer 118 has an etch selectivity, the pattern of patterned photoresist layer 130a and the patterned mask layer 122 directly over the blocking layer 114 may not be formed in the middle layer 118.

Next, by using the middle layer 118 and the blocking layer 114 as an etching mask, the bottom layer 112 is patterned and etched, and the middle layer 118 is removed when patterning the bottom layer 112. Since the blocking layer 114 has etch selectivity with the bottom layer 112 and the middle layer 118, the blocking layer 114 remains over the bottom layer 112. In some embodiments, since the blocking layer 114 is formed in the tri-layer mask structure 121, the pattern of the patterned photoresist layer 130 and the patterned mask layer 122 directly above the blocking layer 114 is not transferred to the bottom layer 112, and the pattern of a guard ring 104 is formed in the bottom layer 112 directly below the blocking layer 114.

Figure 2F:
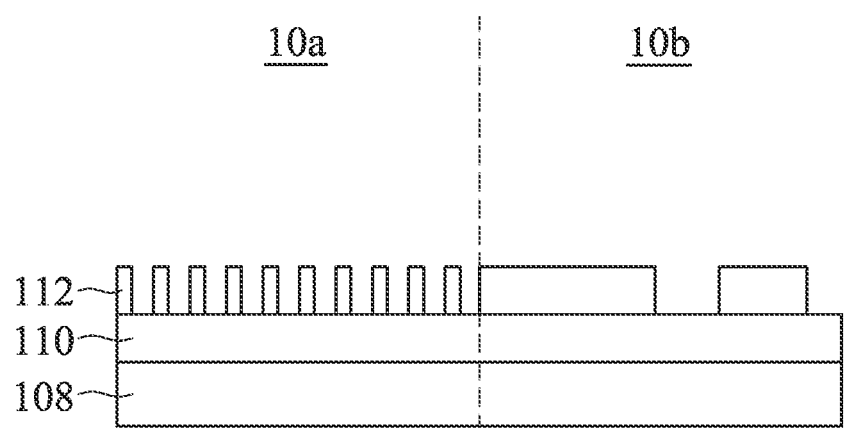

Next, as shown in FIG. 2F, the blocking structure 114' is removed and its underlying bottom layer 112 is exposed. The blocking structure 114' may be removed by a wet etching process or a dry etching process. In some embodiments, the blocking structure 114' is removed by a wet etching process including using phosphoric acid ($H_3PO_4$).

Figure 2G:
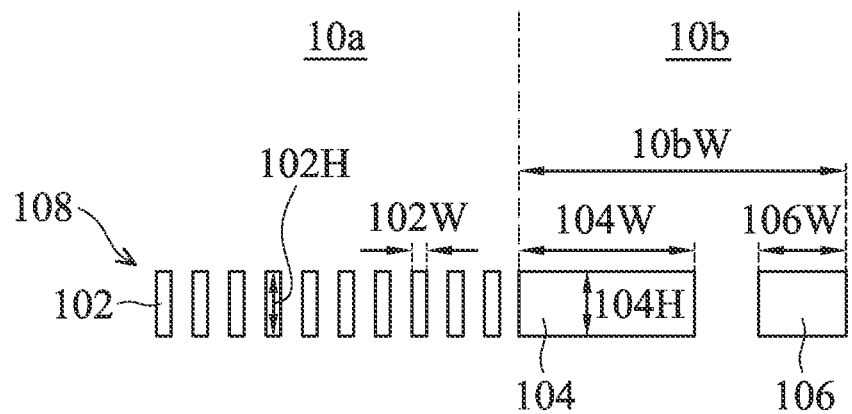

Next, as shown in FIG. 2G, the substrate 108 is patterned by using the bottom layer 112 as a mask. The bottom layer 112 may be used as an etch mask, after the oxide layer 110 is patterned and the bottom layer 112 is removed, the patterned oxide layer 110 may be used as an etching mask and the substrate 108 is patterned. The substrate 108 includes a first portion 102, a second portion 104, and a third portion 106. The first portion 102 of the substrate 108 is in the array region 10a, and may be active area array 102. The widths 102W of each of the active areas 102 in the active area array 102 are substantially the same. In addition, each portion of the active areas 102 has substantially equal height 102H. The second portion 104 of the substrate 108 is in the periphery region 10b and may be a guard ring 104. The guard ring 104 surrounds the active area array 102, and abuts the interface of the array region 10a and the periphery region 10b. In some embodiments, the width 104W of the guard ring 104 is greater than the width 102W of each of the active areas 102. In some embodiments, the width 104W of the guard ring 104 is in a range of about 150 nm to about 400 nm. The ratio of the width 104W of the guard ring 104 to the width 102W of each of the active areas 102 is in a range of about 3 to about 8. In some embodiments, the guard ring 104 has a flat top surface, and every portion of the guard ring 104 has substantially equal height 104H.

The third portion 106 of the substrate 108 is in the periphery region 10b, and may be a periphery structure 106. In some embodiments, the width 104W of the guard ring 104 is greater than the width 106W of the periphery structure 106.

Figure 2H:
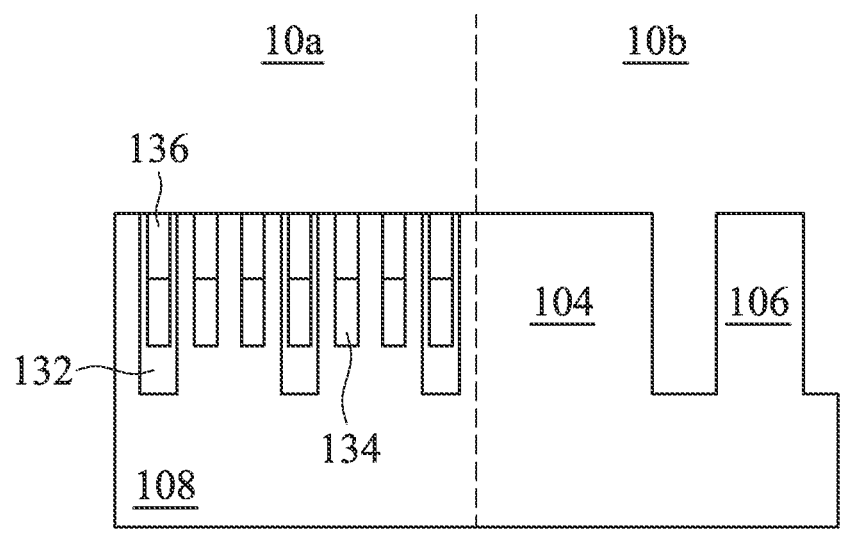

Next, as shown in FIG. 2H, a shallow trench isolation structure 132 is formed in the trench between each active area 102. A liner layer may be formed at the sidewall and the bottom of the shallow trench isolation structure 132. Next, a word line 134 may be formed over the shallow trench isolation structure 132 and between the shallow trench isolation structures 132. The word line 134 may include a gate dielectric layer, a barrier layer, and a conductive layer. Next, the trench above the word line 134 is filled with the isolation material 136.

As mentioned above, by forming a blocking structure in the periphery region abutting the array region, and extending the pattern of the patterned photoresist layer forming the active area array to directly above the blocking structure, the edge portion of the active area array photoresist pattern where the iso dense effect occurs may be directly above the blocking structure. Therefore, when patterning the substrate, the blocking structure may block the iso dense effect at the edge of the active area array pattern, making the sizes of every active area in the array region are substantially the same. In this way, the cost and time of performing the optical proximity correction may be reduced. In addition, the substrate below the blocking structure may be formed as a guard ring at the same time.

What is claimed is:

1. A method for forming a semiconductor structure, comprising:
   forming a substrate including an array region and a periphery region;
   forming a bottom layer over the substrate;
   forming a blocking structure over the bottom layer, wherein the blocking structure is in the periphery region;
   covering a middle layer over the bottom layer and the blocking structure;
   forming a patterned photoresist layer over the middle layer, a first portion of the patterned photoresist layer is disposed in the array region and directly over the blocking structure in the periphery region;
   transferring a pattern of the patterned photoresist layer to the bottom layer in sequence, wherein the pattern of the patterned photoresist layer directly over the blocking structure is not formed in the bottom layer, and a pattern of a guard ring is formed directly below the blocking structure;
   removing the blocking structure; and
   patterning the substrate using the bottom layer as an etching mask, wherein the substrate comprises a first portion, a second portion, and a third portion, the first portion of the substrate is in the array region and is an active area array, the second portion of the substrate is in the periphery region and is the guard ring, the third portion of the substrate is in the periphery region and is a periphery structure, wherein in a cross-section parallel to an edge of the array region, a width of the guard ring is greater than a width of each of the active areas of the active area array, and the width of guard ring is greater than a width of the periphery structure.

2. The method for forming a semiconductor memory structure as claimed in claim 1, wherein a sidewall of the blocking structure is aligned with an interface between the array region and the periphery region.

3. The method for forming a semiconductor memory structure as claimed in claim 1, further comprising:
   forming a patterned mask layer over the middle layer, wherein a pattern of the patterned mask layer is in the array region and extends to directly over the blocking structure in the periphery region,
   wherein a spacing of the pattern of the patterned mask layer in the periphery region and a spacing in the array region are substantially the same.

4. The method for forming a semiconductor memory structure as claimed in claim 1, wherein a spacing of the patterned photoresist layer in the periphery region is greater than a spacing in the array region.

5. The method for forming a semiconductor memory structure as claimed in claim 1, wherein the blocking structure has etch selectivity with the bottom layer and the middle layer.

6. The method for forming a semiconductor memory structure as claimed in claim 1, wherein the middle layer comprises carbon, the blocking structure comprises nitride, and the bottom layer comprises polysilicon.

7. The method for forming a semiconductor memory structure as claimed in claim 3, wherein the pattern of the patterned mask layer and the patterned photoresist layer are different, and the pattern of the patterned mask layer partially overlaps the pattern of the patterned photoresist layer.

8. The method for forming a semiconductor memory structure as claimed in claim 3, wherein the patterned mask layer defines a location of a line of the active area array in the array region, the first portion of the patterned photoresist layer defines a location where the line of the active area array is cut off.

9. The method for forming a semiconductor memory structure as claimed in claim 3, further comprising:
wherein the patterned mask layer comprises oxide, wherein the bottom layer comprises polysilicon.

10. The method for forming a semiconductor memory structure as claimed in claim 1, wherein the blocking structure is in direct contact with the bottom layer.

11. The method for forming a semiconductor memory structure as claimed in claim 1, wherein a top surface of the middle layer is higher than a top surface of the blocking structure.

12. The method for forming a semiconductor memory structure as claimed in claim 1, wherein the guard ring abuts and surrounds the array region.

13. The method for forming a semiconductor memory structure as claimed in claim 1, wherein in a cross-section parallel to an edge of the array region, a width of the guard ring is greater than a width of each of the active areas, and the width of guard ring is greater than a width of the periphery structure.

14. The method for forming a semiconductor memory structure as claimed in claim 1, wherein in a cross-section parallel to an edge of the array region, the widths of each of the active areas are substantially the same.

15. A semiconductor structure, comprising:
a substrate comprising an array region and a periphery region;
a guard ring disposed in the periphery region abutting and surrounding the array region;
an active area array comprising a plurality of active areas disposed in the array region; and
a periphery structure disposed in the periphery region,
wherein the guard ring and the periphery structure are separated from each other, wherein in a cross-section parallel to an edge of the array region, a width of the guard ring is greater than a width of each of the active areas, and the width of guard ring is greater than a width of the periphery structure.

16. The semiconductor structure as claimed in claim 15, wherein in a cross-section parallel to an edge of the array region, the widths of each of the active areas are substantially the same.

17. The semiconductor structure as claimed in claim 15, wherein in a cross-section parallel to an edge of the array region, a width ratio of the guard ring and each of the active areas is in a range of about 3 to about 8.

18. The semiconductor structure as claimed in claim 15, further comprising:
a shallow trench isolation structure formed between each of the active areas;
a liner layer formed at a sidewall and a bottom of the shallow trench isolation structure; and
a word line formed over the shallow trench isolation structure and between the shallow trench isolation structures.

19. The semiconductor structure as claimed in claim 15, wherein every portion of the guard ring has substantially equal height.

20. The semiconductor structure as claimed in claim 15, further comprising:
a plurality of word lines disposed in the plurality of active areas and between the plurality of active areas, not over the guard ring and the periphery structure.

* * * * *